United States Patent
Heit et al.

(10) Patent No.: US 11,137,763 B2
(45) Date of Patent: Oct. 5, 2021

(54) GENERATING AND FUSING TRAFFIC SCENARIOS FOR AUTOMATED DRIVING SYSTEMS

(71) Applicant: Faraday & Future Inc., Gardena, CA (US)

(72) Inventors: Juergen Heit, Mountain View, CA (US); Jan Becker, Palo Alto, CA (US)

(73) Assignee: Faraday & Future Inc., Gardena, CA (US)

( * ) Notice: Subject to any disclaimer, the term of this patent is extended or adjusted under 35 U.S.C. 154(b) by 0 days.

(21) Appl. No.: 16/306,533

(22) PCT Filed: May 30, 2017

(86) PCT No.: PCT/US2017/035064
§ 371 (c)(1),
(2) Date: Nov. 30, 2018

(87) PCT Pub. No.: WO2017/210222
PCT Pub. Date: Dec. 7, 2017

(65) Prior Publication Data
US 2020/0183387 A1    Jun. 11, 2020

Related U.S. Application Data

(60) Provisional application No. 62/343,058, filed on May 30, 2016.

(51) Int. Cl.
*G05D 1/00* (2006.01)
*G06F 30/20* (2020.01)
*G06K 9/00* (2006.01)

(52) U.S. Cl.
CPC .......... *G05D 1/0088* (2013.01); *G06F 30/20* (2020.01); *G06K 9/00805* (2013.01); *G05D 2201/0213* (2013.01)

(58) Field of Classification Search
CPC .......... G05D 1/0088; G05D 2201/0213; G06F 30/20; G06K 9/00805
See application file for complete search history.

(56) References Cited

U.S. PATENT DOCUMENTS 8,521,352 B1 *  8/2013  Ferguson ............. G05D 1/0274
                                                        701/25
2013/0211656 A1  8/2013  An et al.
(Continued)

OTHER PUBLICATIONS

International Search Report dated Oct. 30, 2017 for International Application No. PCT/US2017/035064.

*Primary Examiner* — Marthe Y Marc-Coleman
(74) *Attorney, Agent, or Firm* — Veros Legal Solutions LLP

(57) ABSTRACT

Automated driving systems intended for use in a vehicle can be simulated and validated using automatically generated simulation scenarios. A large number of simulation scenarios can be generated by augmenting a plurality of recorded scenarios with one or more extracted data streams. The extracted data streams can correspond to objects such as other vehicles, pedestrians, cyclists, or other obstacles or barriers. The extracted data streams can be generated automatically by identifying similar recorded scenarios and isolating differences between the similar recorded scenarios.

18 Claims, 5 Drawing Sheets

(56) References Cited

U.S. PATENT DOCUMENTS

| | | | |
|---|---|---|---|
| 2013/0223686 A1* | 8/2013 | Shimizu | G08G 1/166 |
| | | | 382/103 |
| 2014/0195093 A1 | 7/2014 | Litkouhi et al. | |
| 2015/0158486 A1 | 6/2015 | Healey et al. | |
| 2015/0175168 A1 | 6/2015 | Hoye et al. | |
| 2015/0310154 A1 | 10/2015 | Bobok et al. | |
| 2016/0357188 A1* | 12/2016 | Ansari | G06K 9/00805 |

\* cited by examiner

GENERATING AND FUSING TRAFFIC SCENARIOS FOR AUTOMATED DRIVING SYSTEMS

CROSS-REFERENCE TO RELATED APPLICATIONS

This application is a National Phase application under 35 U.S.C. § 371 of International Application No. PCT/US2017/035064, filed May 30, 2017, which claims the benefit of U.S. Provisional Application No. 62/343,058, filed May 30, 2016, the entirety of each of which is hereby incorporated by reference.

FIELD OF THE DISCLOSURE

This relates generally to automated driving and driving assistance systems, and more particularly, to simulation and validation of vehicle systems for automated driving.

BACKGROUND OF THE DISCLOSURE

Modern vehicles, especially automobiles, increasingly provide automated driving and driving assistance systems such as blind spot monitors, automatic parking, and automatic navigation. Testing and validating automated driving and driving assistance systems, however, is highly complex and can require prolonged road testing (e.g., millions of hours and miles). The testing and validation effort is multiplied when considering that updates to the automated driving and driving assistance systems can require revalidation, and separate validation may be required for different vehicles types.

SUMMARY OF THE DISCLOSURE

This relates to simulation and validation of automated driving systems for a vehicle. A large number of simulation scenarios can be automatically generated by augmenting a plurality of recorded scenarios with one or more extracted data streams. The extracted data streams can correspond to objects such as other vehicles, pedestrians, cyclists, or other obstacles or barriers. The extracted data streams can be generated automatically by identifying similar recorded scenarios and isolating differences between the similar recorded scenarios. Automatically generating a large number of scenarios for simulation can reduce validation effort by triggering system faults before failures are observed in real-world traffic.

DETAILED DESCRIPTION

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

This relates to simulation and validation of automated driving software for a vehicle. A large number of simulation scenarios can be automatically generated by augmenting a plurality of recorded scenarios with one or more extracted data streams. The extracted data streams can correspond to objects such as other vehicles, pedestrians, cyclists, obstacles or barriers, and/or other traffic participants. The extracted data streams can be generated automatically by identifying similar recorded scenarios and isolating differences between the similar recorded scenarios. Automatically generating a large number of scenarios for simulation can reduce validation effort by triggering system faults before failures are observed in real-world traffic.

Figure 1:
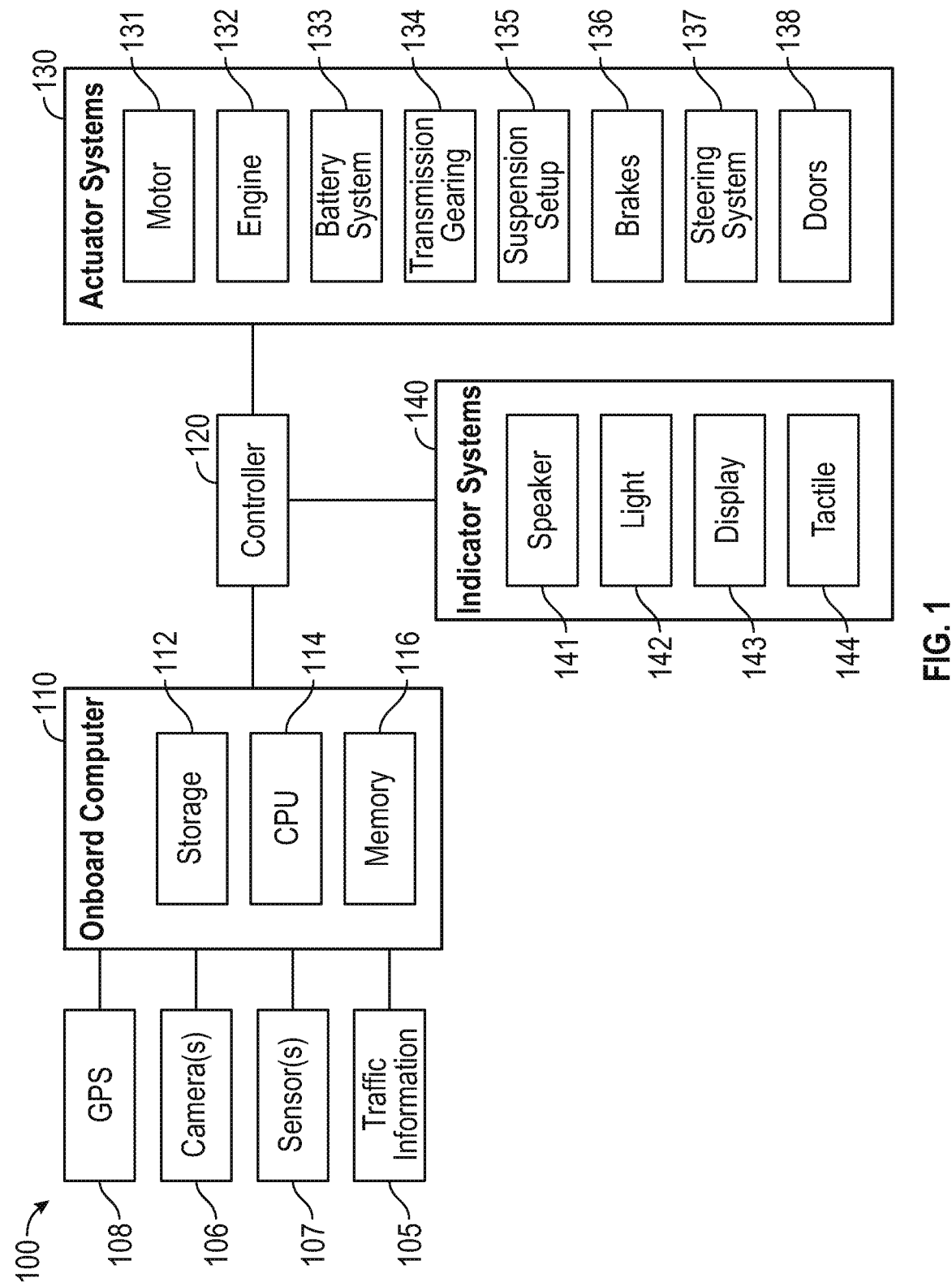
FIG. 1 illustrates an exemplary system block diagram of a vehicle control system including automated driving software according to examples of the disclosure.

FIG. 1 illustrates an exemplary system block diagram of a vehicle control system including automated driving software according to examples of the disclosure. Vehicle control system 100 can perform automated driving and driving assistance. System 100 can be incorporated into a vehicle, such as a consumer automobile. Other example vehicles that may incorporate the system 100 include, without limitation, airplanes, boats, motorcycles or industrial automobiles. Vehicle control system 100 can include one or more cameras 106 capable of capturing image data (e.g., video data) for determining various characteristics of the vehicle's surroundings. Vehicle control system 100 can also include one or more other sensors 107 (e.g., radar, ultrasonic, LIDAR, etc.) capable of detecting various characteristics of the vehicle's surroundings. For example, sensors 107 can be used for detecting the presence of an object. Global Positioning System (GPS) receiver 108 capable of determining the location of the vehicle. In some examples, traffic information 105 can be received (e.g., by an antenna) or accessed (e.g., from storage 112 or memory 116), and can be used for determining automated driving routes.

Vehicle control system 100 can include an on-board computer 110 coupled to the traffic information 105, cameras 106, sensors 107, and GPS receiver 108. On-board computer 110 can be capable of receiving one or more of the traffic information, image data from the cameras, outputs from the sensors 107 and the GPS receiver 408. On-board computer 110 can include storage 112, memory 116, and a processor (central processing unit (CPU)) 114. CPU 114 can execute automated driving software stored in storage 112 and/or memory 114. For example, CPU 114 can process the traffic information, image data, sensor outputs and GPS outputs and make driving decisions thereon. For example, processing can include detecting and tracking objects in the environment, tracking vehicle parameters (e.g., odometry, location), navigation planning, lane selection/change planning, motion planning, determining automated driving commands, etc. Additionally, storage 112 and/or memory 116 can store data and instructions for performing the above processing. Storage 112 and/or memory 116 can be any non-transitory computer readable storage medium, such as a solid-state drive, a hard disk drive or a random access memory (RAM) among other possibilities.

The vehicle control system 100 can also include a controller 120 capable of controlling one or more aspects of vehicle operation based on automated driving commands received from the processor. In some examples, the vehicle control system 100 can be connected to (e.g., via controller 120) one or more actuator systems 130 in the vehicle and one or more indicator systems 140 in the vehicle. The one or more actuator systems 130 can include, but are not limited to, a motor 131 or engine 132, battery system 133, transmission gearing 134, suspension setup 135, brakes 136, steering system 137, and door system 138. The vehicle control system 100 can control, via controller 120, one or more of these actuator systems 130 during vehicle operation; for example, to open or close one or more of the doors of the vehicle using the door actuator system 138, to control the vehicle during autonomous driving or parking operations using the motor 131 or engine 132, battery system 133, transmission gearing 134, suspension setup 135, brakes 136 and/or steering system 137, etc. The one or more indicator systems 140 can include, but are not limited to, one or more lights 142 in the vehicle, one or more tactile actuators 144 in the vehicle (e.g., as part of a steering wheel or seat in the vehicle), and/or one or more infotainment systems 145 (e.g., providing entertainment and/or information to the user). The vehicle control system 100 can control, via controller 120, one or more of these indicator systems 140 to provide indications to a user of the vehicle.

Figure 2:
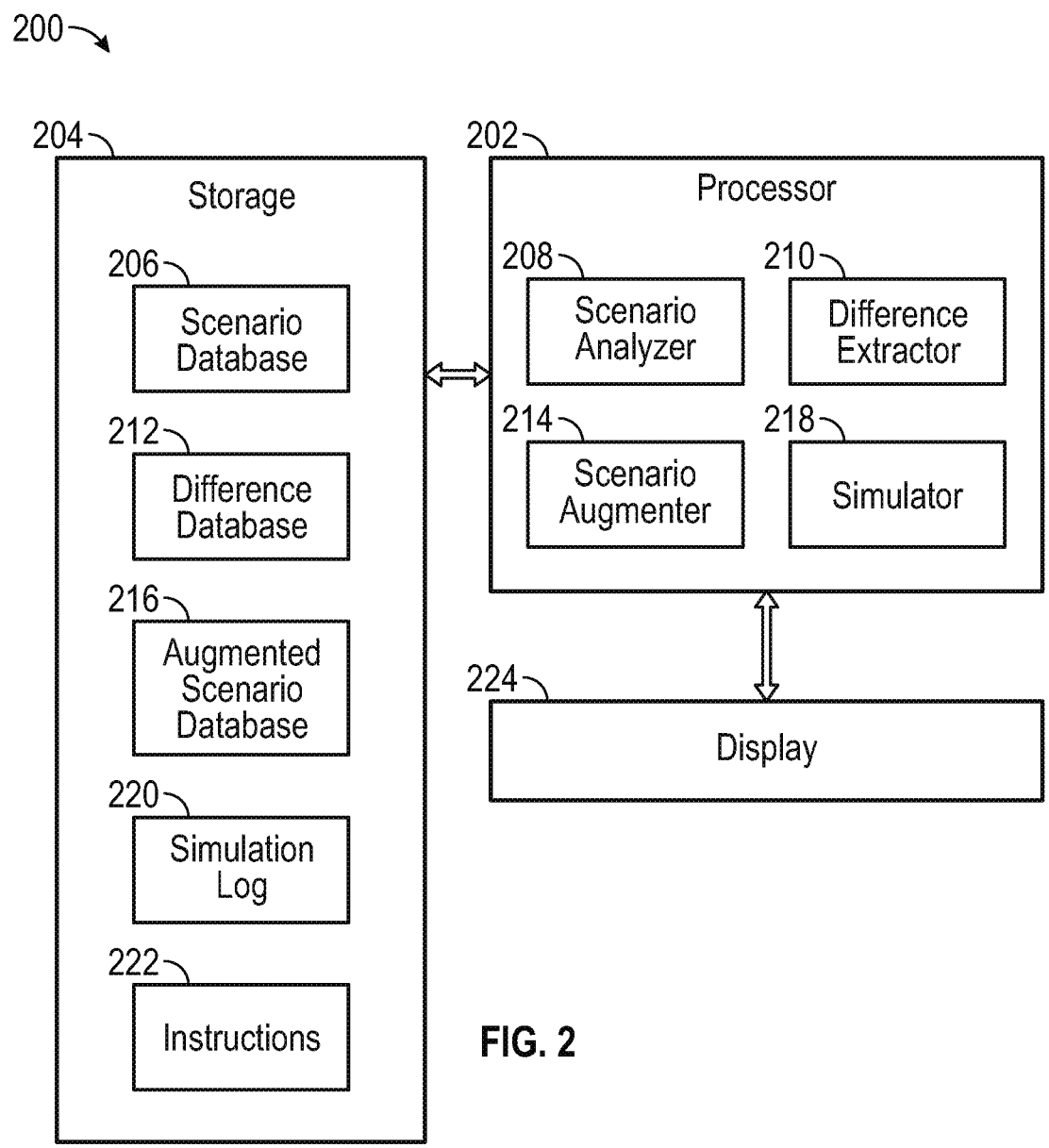
FIG. 2 illustrates an exemplary system block diagram configured for simulation and validation of vehicle software for automated driving according to examples of the disclosure.

As described above, rather than testing and validating the automated driving software with real-world sensor inputs from actual road testing, simulations can be used to validate the automated driving software. FIG. 2 illustrates an exemplary system block diagram configured for simulation and validation of vehicle software for automated driving according to examples of the disclosure. System 200 can include processor 202, storage 204, and display 224. Processor 202 can be coupled to storage 204 to enable the transfer of data therebetween for processing and storage. Processor 202 can be coupled to display 224 to enable presentation of a visualization of the simulation and validation, including information about performance of the automated driving software under test (e.g., status, number of passed simulations, number of failed simulations). Although FIG. 2 illustrates one processor 202, system 200 can be implemented with one or more computers including one or more processors running a multitude of software processes. In some examples, each software process can be executed on a different CPU in a computing cluster or mainframe. Additionally, in some examples, processing performed by processor 202 can be implemented in hardware, firmware, software or a combination thereof.

Processor 202 can be configured to perform one or more processes including: a sensor data management process for storing and accessing sensor data streams/scenarios recorded from real-world vehicle driving or artificially generated environments and road traffic, a detection process for automatically detecting similar sensor data streams/scenarios (e.g., sharing at least one characteristic), an extraction process for extracting differences between two similar sensor data streams/scenarios, an extracted data management process for storing the extracted differences, an augmentation process for augmenting recorded sensor data streams/scenarios with one or more of the extracted differences, a simulation process for simulating the operation of the vehicle software by using recorded or augmented sensor data streams/scenarios as inputs to the automated driving software, a coordination process for coordinating which sensor data streams/scenarios to supply as inputs (e.g., in parallel or in sequence), a tracking process for keeping track of the versions of vehicle software to be validated, the sensor data streams/scenarios used for validation, and which of the extracted differences have already been used to augment other sensor data streams/scenarios, and a logging and/or visualization process for keeping track of the performance of the automated driving software during simulation. Any or all of the above processes can be performed automatically with minimal or no user input. These processes will be described in more detail below.

Storage 204 can include one or more non-transitory computer readable storage media, such as a solid-state drive, hard disk drive, a random access memory (RAM) or other possibilities. Storage 204 can include one or more of a scenario database 206, a difference database 212, an augmented scenario database 216, a simulation log 220 and instructions 222. Scenario database 206 can store sensor data streams/scenarios recorded from real-world vehicle driving of one or more vehicles or artificially generated environments and road traffic. The real-world vehicle data streams/scenarios can be acquired from traffic info 105, cameras 106, sensors 107 and GPS receiver 108 in one or more vehicles. Difference database 212 can store the extracted differences between similar data streams/scenarios. Augmented scenario database 216 can store sensor data streams/scenarios augmented with one or more of the extracted differences. Simulation log 220 can store records of the performance of the automated driving software under test (e.g., whether a collision is detected or not). Instructions 222 can include instructions to be executed by processor 202 to simulate and validate the automated driving software as described herein. Although illustrated separately, one or more of scenario database 206, difference database 212, augmented scenario database 216, simulation log 220 and instructions 222 can be implemented in the same computer readable storage medium.

Figure 3:
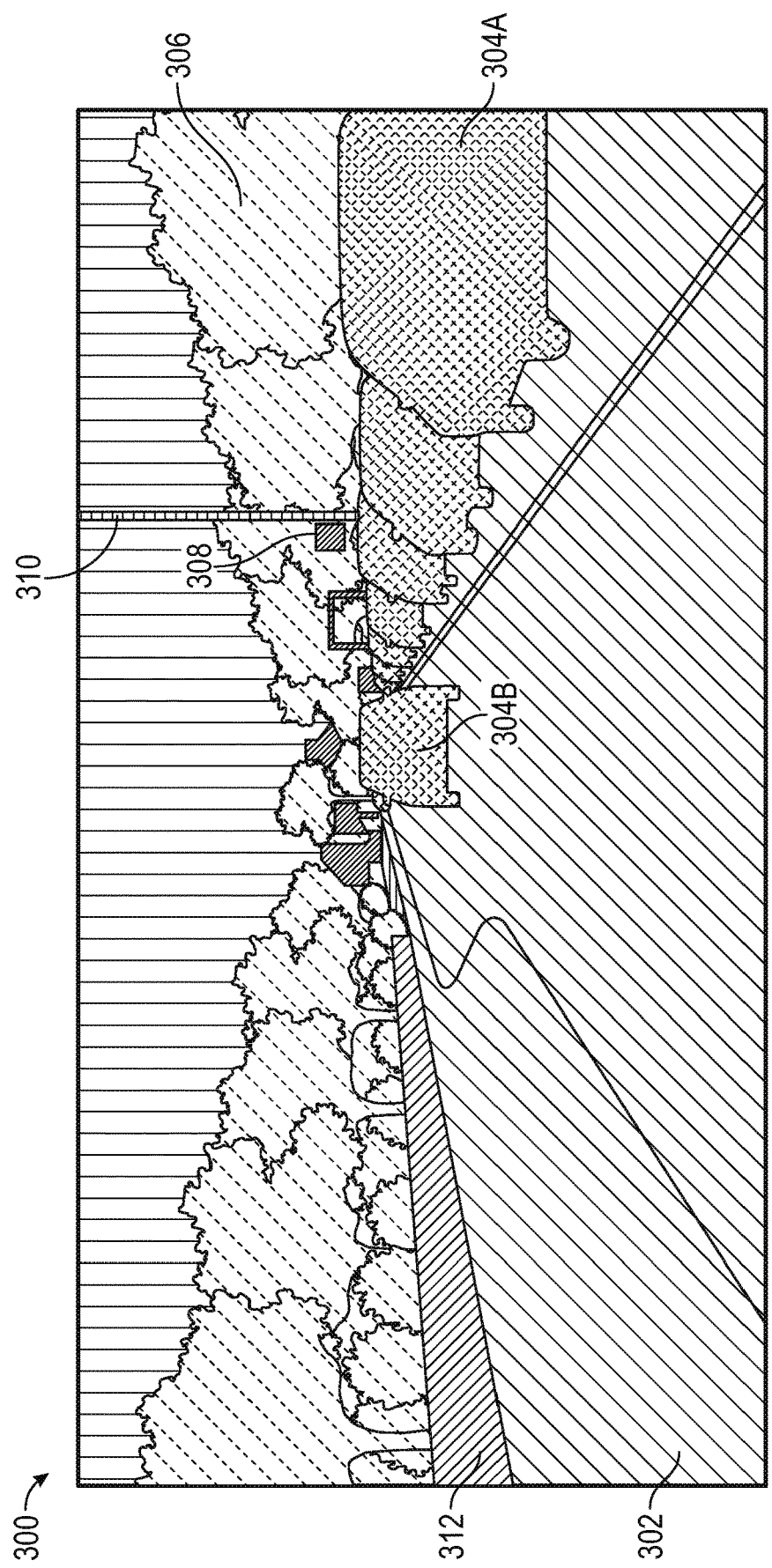
FIG. 3 illustrates an exemplary object-level representation of an environment according to examples of the disclosure.

Scenarios can be represented with raw sensor data streams from sensors (e.g., cameras, radar, etc.) or after processing as data streams at a higher level of abstraction. For example, the raw sensor data can be processed and represented at various levels of abstraction. For example, the raw sensor data may be combined or modified into higher level sensor data. In some examples, objects (e.g., other vehicles, signs, pedestrians, cyclists, lanes, barriers, foliage, etc.) can be recognized and tracked as they would be perceived by a human driver. It should be understood that the processing and storage for simulation and validation as described herein can be performed using representations including raw data streams, processed data streams, or objects (or a combination thereof). FIG. 3 illustrates an exemplary object-level representation of an environment according to examples of the disclosure. Environment 300 can be segmented to identify different objects from the data streams, and some or all of the identified objects can be tracked. The objects can include roads 302, cars 304A-B, pedestrians, cyclists, foliage 306, traffic signs or signals 308, utility poles 310, barriers 312 or the like. In some examples, objects may include poles, telephone poles, bushes, trees, advertisements such as bill boards, phone booths, statues, mail boxes, art work, trash cans and/or dumpsters. It should be understood that some objects can be important to accurately mimic real-world scenarios, despite some or all of such objects not constituting an obstacle or barrier. In some examples, only objects of interest are identified and/or tracked. In some examples, after identifying objects at an abstract level, raw or processed sensor data streams corresponding to the object can be extracted from a scenario for use in automatic generation of augmented scenarios.

Returning to FIG. 2, processor 202 can include a scenario analyzer 208, a difference extractor 210, a scenario augmenter 214 and a simulator 218. The functionality of each of scenario analyzer 208, difference extractor 210, scenario augmenter 214 and simulator 218 may be automatic such that little or no user input is required for simulation and validation of automated driving software. Scenario analyzer 208 can receive data streams/scenarios from scenario database 206 (e.g., via the sensor data management process). Scenario analyzer can perform a detection process that can include comparing sensor data streams/scenarios and identifying data streams/scenarios with similar properties (e.g., at least one shared characteristic). For example, GPS coordinates could be used to identify data streams/scenarios that are recorded at the same location as being similar data streams/scenarios. Difference extractor 210 can perform an extraction process that can include extracting differences between two similar sensor data streams/scenarios identified by scenario analyzer 208. The differences can include different distributions of objects, such as a different number and/or placement of vehicles, pedestrians and cyclists, for example. The differences can also include other barriers or obstacles. The extracted differences can also include representation of the dynamic behavior (e.g., movement) of the objects. The extracted differences can be stored in difference database 212 (e.g., via the extracted data management process). For example, the data stream/object corresponding to each of the one or more differences can be extracted from the similar data streams/scenarios. In addition to the extracted differences, in some examples, metadata corresponding to the extracted differences can be stored as well. For example, the metadata can include whether or not a collision occurred or whether a collision avoidance maneuver was necessary.

Scenario augmenter 214 can generate augmented scenarios based on recorded scenarios in scenario database 206 and the extracted differences in 212. The discrete objects (or corresponding data stream(s)) identified in the extracted differences, for example, can be added into recorded scenarios to generate augmented scenarios (e.g., fusing extracted data streams into previously recorded data streams). In some examples, different numbers and placement of objects identified in the extracted differences can be added into previously recorded scenarios. The augmented scenarios can represent a multitude of automatically generated permutations of the recorded scenarios and extracted differences that can be used to simulate and validate the automated driving software. Thus, a more limited database of recorded scenarios can be leveraged automatically to generate much larger data sets for testing and validation of automated driving software. In some examples, the augmented scenarios can be stored in augmented scenario database 216 for use in simulation. In some examples, rather than storing augmented scenarios, the augmented scenarios can be used for simulation and then can be discarded so as to reduce storage requirements of the system.

Simulator 218 can receive scenarios from one or more of scenario database 206 (e.g., recorded scenarios), augmented scenario database 216 and scenario augmenter 214 (e.g., augmented scenarios). Simulator 218 can perform the simulation process, including simulating the operation of the vehicle software by using the received scenarios as inputs to the automated driving software under test. Simulator can monitor whether the commands generated by the automated driving software result in a collision. The results of the simulations can be logged in simulation log 220.

In some examples, simulator 218 can also perform the coordination process for coordinating which scenarios to supply as inputs, the tracking process for keeping track of the versions of vehicle software to be validated, the scenarios used for validation, and which of the extracted differences have already been used to augment other sensor data streams/scenarios, and a logging process keeping track of the performance of the automated driving software during simulation. In other examples, these processes can be performed by processor 202, separately from simulator 218.

In some examples, each time a new scenario is added to scenario database 206, scenario analyzer 208 can search the scenario database 206 for similar scenarios and extract the differences from each of the similar scenarios. In some examples, to reduce processing requirements, after difference extraction from similar scenarios, one of the two similar scenarios used for difference extraction can either be discarded/deleted or not used for future scenario analysis because aside from the extracted difference, the similar scenarios are otherwise "the same" (relevant differences already extracted).

Figure 4:
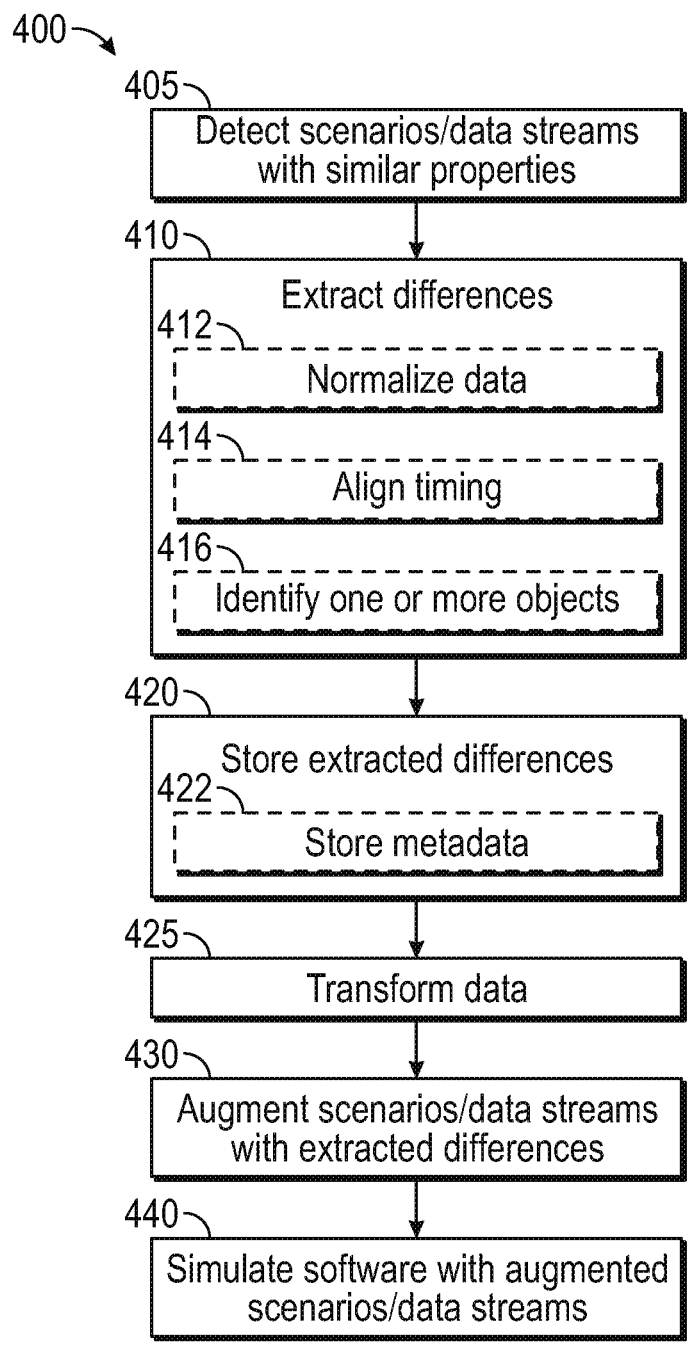
FIG. 4 illustrates an example process for simulation and validation of vehicle software for automated driving according to examples of the disclosure.

FIG. 4 illustrates an example process 400 for simulation and validation of vehicle software for automated driving according to examples of the disclosure. At 405, the simulation and validation system can detect scenarios/data streams with similar properties (e.g., using scenario analyzer 208). For example, the properties may include GPS location, vehicle dynamics, lane, time of day, weather conditions, etc. For example, when a vehicle drives the same route multiple times, different situations can be encountered. The differences can include different traffic users, such as bicyclists, pedestrians and cars, and different sets of obstacles that must be avoided by the automated driving system. At 410, the simulation and validation system can extract differences between the similar scenarios/data streams (e.g., using difference extractor 210). In some examples, extracting the differences can include subtraction of sensor data streams collected at approximately the same location. In some examples, before subtractions, the data stream may be normalized to reduce noise and unwanted artifacts stemming from this operation (412). For example, time of day or weather conditions can result in differences in sensor data streams, but may not be meaningful from an automated driving validation perspective. Additionally, objects that are not of interest can be filtered out. In some examples, time series of sequential sensor data streams may be aligned to account for differences in vehicle speed, acceleration/deceleration, location of stops, lane, etc. between different data streams/scenarios corresponding to the same routes (414). Dynamic time warping or similar approaches suitable for the sensor suite of autonomous vehicles may be used for the sequence alignment. In some examples, objects (rather than raw data streams) can be recognized and tracked, and extracting the data can include extracting the sensor data streams associated with one or more tracked objects (416). Extracting data streams corresponding to objects of interest can reduce the amount of data to be extracted and can also lead to less noise being carried forward into later processing steps. At 420, the extracted differences can be stored (e.g., in difference database 212), and in some examples, metadata corresponding to the extracted sensor data can be stored. The metadata can include information about whether a collision was encountered or not, or whether a collision avoidance maneuver was necessary. The extracted differences can be used to generate augmented data streams for simulation (e.g., using scenario augmenter 214).

In some examples, to prevent generating augmented sensor data streams/scenarios with occlusions, the extracted differences and/or recorded sensor data streams can be transformed at 425, when necessary. For example, if differences extracted from similar scenarios on a road with no incline are fused with a scenario recorded on a road with an incline, the injected differences may be occluded and therefore ineffective for simulation purposes. In such examples, transformations can be used to adjust the injected object, the underlying recorded scenario, or both, such that the injected difference is not occluded.

At 430, the simulation and validation system can augment sensor data for validation with the extracted differences (e.g., using scenario augmenter 214). For example, the scenario database 206 may include N recorded scenarios (base scenarios) and difference database 312 can include M extracted differences. The system can generate augmented data streams by adding one or more of the M extracted differences to any of the base scenarios. Thus, the augmentation process can automatically generate large quantities of augmented scenarios that can be used to simulate and validate the proper operation of the automated driving software without prolonged road testing.

At 440, the simulation and validation system can simulate the results of the software based on augmented and/or non-augmented data streams/scenarios (e.g., using simulator 218). The simulation and validation system can store the results of the simulation (e.g., in simulation log 220). For example, the system may record whether or not a collision was encountered. If no collision was encountered in the recorded data streams/scenarios modified by augmentation, then no collision should be encountered when simulating the automated driving software using the augmented data streams/scenarios.

Figure 5A:
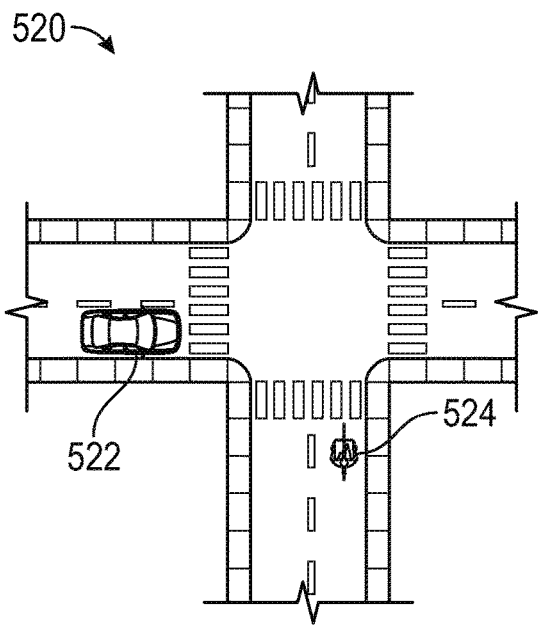
FIGS. 5A-5D illustrate example scenarios according to examples of the disclosure.
Figure 5B:
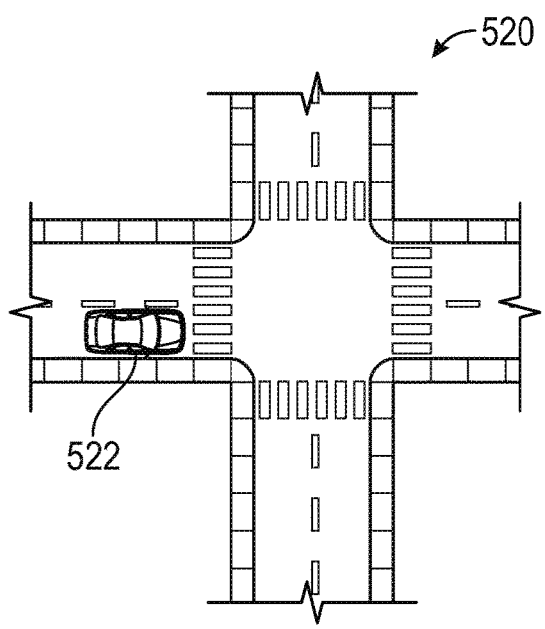

FIGS. 5A-5D illustrate example scenarios according to examples of the disclosure. FIGS. 5A and 5B illustrate a first scenario and a second scenario corresponding to vehicle 522 approaching intersection 520 in two different instances. Sensors in vehicle 522 can be used to capture data (data streams and/or object segmentation) about the surrounding environment. In the first scenario illustrated in FIG. 5A, the data stream can include a cyclist 524. However, in the second scenario illustrated in FIG. 5B, the cyclist is absent. The simulation and validation system can automatically detect that the first and second scenarios are similar (e.g., based on at least one shared characteristic such as the GPS location). The difference between the first and second scenarios—cyclist 524—can be extracted (as an object or data stream). The data streams associated with cyclist 524 can be automatically injected (possibly along with other extracted differences) into other recorded scenarios to generate a large quantity of augmented scenarios for simulation.

Figure 5C:
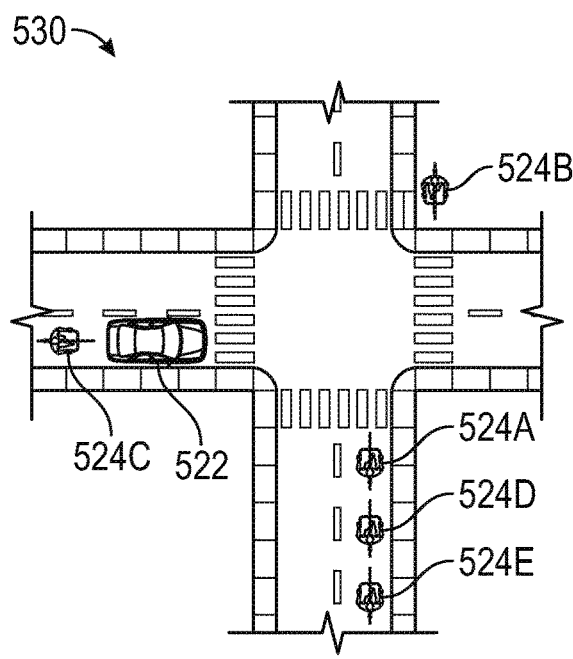
Figure 5D:
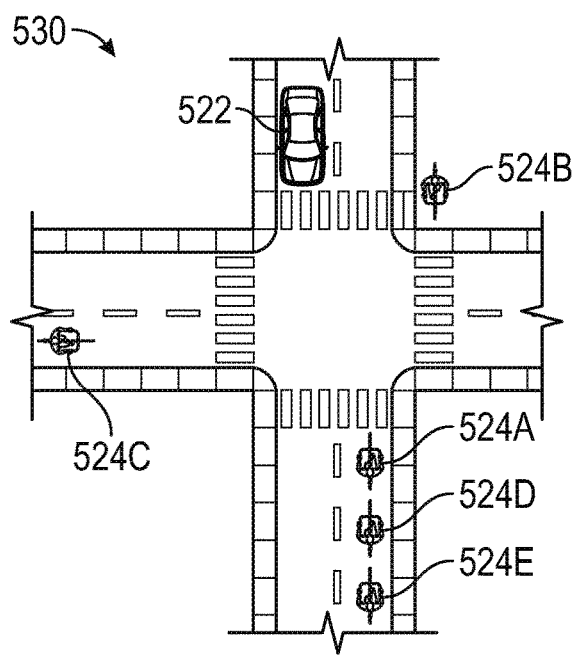

In some examples, the system can inject one or more instances of the extracted difference in one or more locations. For example, FIG. 5C illustrates the recorded scenario of FIG. 5B augmented to include one or more instances of the extracted cyclist. For example, three cyclists 524A, 524D and 524E can be injected into the scenario approaching intersection 530 on the street running perpendicular to the street on which vehicle 522 is located. Additionally or alternatively, a cyclist 524B can be injected on a corner of the intersection 530. Additionally or alternatively, a cyclist 524C can be injected behind vehicle 522. Different permutations of base scenarios, and the number and placement of one or more extracted differences can be used to automatically generate a large number of simulation scenarios for validation. FIG. 5D illustrates another example scenario, but in FIG. 5D vehicle 522 approaches intersection 530 from a different direction. The cyclists 524A-524E can be injected into the scenario in a similar manner as described above with respect to FIG. 5C to generate multiple scenarios for simulation and validation. In some examples, the augmentation process can intelligently provide the number and/or location of an extracted difference to inject into base scenarios. In other examples, the augmentation process can adjust the number and/or location randomly.

In some examples, rather than injecting a selected number of one or more instances of an extracted difference into one or more locations, the augmentation process can include injecting extracted data as is (as measured, and in the location measured). A scenario as illustrated in FIG. 5C-5D can still be generated, but first the system may need to extract from analysis of various data streams/scenarios, a cyclist in each of the locations shown. For example, in a first instance the vehicle may detect an empty intersection (as illustrated in FIG. 5B) and in a second instance the vehicle may detect a cyclist 524 (as illustrated in FIG. 5A), which can be extracted. Injecting the cyclist 524 detected and extracted from the data stream/scenario corresponding to FIG. 5A can result in the injection of cyclist 524A as illustrated in FIG. 5C. Although not show, in third instance, the vehicle may detect a cyclist on the corner and behind the vehicle, which can be extracted (e.g., based on a comparison with the scenario of FIG. 5B) and later injected as cyclist 524B and 524C. Likewise, in a fourth instance, the vehicle may detect two cyclists, which can be extracted and injected as cyclists 524D and 524E. In a similar way, differences can be extracted and combined into different base scenarios to generate multiple augmented scenarios for testing and validation.

Although FIGS. 5A-5D illustrate the extracted and injected differences statically, the injected differences can include dynamic movement of the object of interest. For example, the injected difference may not simply be a stationary cyclist on a bike, but may be represented as cyclist moving in time and space. Additionally, it should be understood that although FIGS. 5A-5D illustrate cyclist 524 as the difference that is extracted, the differences can include one or more of one or more different types of objects, as described herein.

Therefore, according to the above, some examples of the disclosure are directed to a method. The method can comprise: extracting data from a first scenario or a second scenario, the data corresponding to a difference between the first scenario recorded by one or more first vehicle sensors and the second scenario recorded by one or more second vehicle sensors, wherein the first scenario shares at least one characteristic with the second scenario; injecting the extracted data into a third scenario recorded by one or more third vehicle sensors to generate a fourth scenario; and simulating automated vehicle driving software with the fourth scenario. Additionally or alternatively to one or more of the examples disclosed above, in some examples, the method can further comprise automatically comparing a plurality of scenarios to identify the first scenario and the second scenario sharing the at least one characteristic. Additionally or alternatively to one or more of the examples disclosed above, in some examples, the at least one shared characteristic can be shared global position system (GPS) coordinates. Additionally or alternatively to one or more of the examples disclosed above, in some examples, extracting the data can comprise subtracting data recorded by a type of vehicle sensor recording in the first scenario from data recorded by a corresponding type of vehicle sensor recording in the second scenario. Additionally or alternatively to one or more of the examples disclosed above, in some examples, extracting the data can comprise normalizing the first scenario and the second scenario before extracting the data or normalizing the extracted data after extracting the data. Additionally or alternatively to one or more of the examples disclosed above, in some examples, extracting the data can comprise aligning the first scenario and the second scenario to account for differences due to vehicle speed or vehicle position. Additionally or alternatively to one or more of the examples disclosed above, in some examples, extracting the data can comprise identifying an object; and extracting a data stream corresponding to the identified object. Additionally or alternatively to one or more of the examples disclosed above, in some examples, the object can be one of a pedestrian, animal, vehicle or cyclist. Additionally or alternatively to one or more of the examples disclosed above, in some examples, the data can include dynamics of the extracted object. Additionally or alternatively to one or more of the examples disclosed above, in some examples, the data can be a data stream from one or more vehicle sensors. Additionally or alternatively to one or more of the examples disclosed above, in some examples, the method can further comprise storing the extracted data and corresponding metadata in memory. Additionally or alternatively to one or more of the examples disclosed above, in some examples, the metadata can include whether a collision occurred or not in the first scenario or the second scenario from which the data is extracted. Additionally or alternatively to one or more of the examples disclosed above, in some examples, the method can further comprise transforming the extracted data or third scenario prior to injecting the extracted data into the third scenario. Additionally or alternatively to one or more of the examples disclosed above, in some examples, the method can further comprise automatically generating a plurality of augmented scenarios, each of the plurality of augmented scenarios created by injecting one or more of a plurality of data extracted from one or more recorded scenarios into one or more of a plurality of recorded scenarios; and automatically simulating the automated vehicle driving software with the plurality of augmented scenarios. Additionally or alternatively to one or more of the examples disclosed above, in some examples, extracting the data and injecting the extracted data can be performed automatically.

Some examples of the disclosure are directed to a non-transitory computer-readable medium including instructions, which when executed by one or more processors, can cause the one or more processors to perform any of the above methods. Some examples of the disclosure are directed to a system. The system can comprise one or more processors; and a non-transitory computer-readable medium coupled to the processor. The non-transitory computer-readable medium including instructions, which when executed by one or more processors, can cause the one or more processors to perform any of the above methods.

Some examples of the disclosure are directed to a system. The system can comprise a first database comprising a plurality of recorded scenarios; a second database comprising a plurality of extracted data; and one or more processors coupled to the first and second databases. The one or more processors can be configured to: automatically analyze the plurality of scenarios in the first database to identify scenarios sharing at least one characteristic; extract data corresponding to one or more differences between the identified scenarios; store the extracted data in the second database; and generate a plurality of augmented scenarios based on the plurality of scenarios and the plurality of extracted data. Additionally or alternatively to one or more of the examples disclosed above, in some examples, the one or more processors can be further configured to simulate automated driving software with the plurality of augmented scenarios.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:

1. A method comprising:
   extracting data from a first scenario or a second scenario, the data corresponding to a difference between the first scenario recorded by one or more first vehicle sensors and the second scenario recorded by one or more second vehicle sensors, wherein the first scenario shares at least one characteristic with the second scenario;
   injecting the extracted data into a third scenario recorded by one or more third vehicle sensors to generate a fourth scenario; and
   simulating automated vehicle driving software with the fourth scenario.

2. The method of claim 1, further comprising:
   automatically comparing a plurality of scenarios to identify the first scenario and the second scenario sharing the at least one characteristic.

3. The method of claim 1, wherein the at least one shared characteristic is shared global position system (GPS) coordinates.

4. The method of claim 1, wherein extracting the data comprises:
   subtracting data recorded by a type of vehicle sensor recording in the first scenario from data recorded by a corresponding type of vehicle sensor recording in the second scenario.

5. The method of claim 1, wherein extracting the data comprises:
   normalizing the first scenario and the second scenario before extracting the data or normalizing the extracted data after extracting the data.

6. The method of claim 1, wherein extracting the data further comprises:
   aligning the first scenario and the second scenario to account for differences due to vehicle speed or vehicle position.

7. The method of claim 1, wherein extracting the data further comprises:
   identifying an object; and
   extracting a data stream corresponding to the identified object.

8. The method of claim 7, wherein the object is one of a pedestrian, animal, vehicle or cyclist.

9. The method of claim 7, wherein the data includes dynamics of the extracted object.

10. The method of claim 1, wherein the data is a data stream from one or more vehicle sensors.

11. The method of claim 1, further comprising:
    storing the extracted data and corresponding metadata in memory.

12. The method of claim 11, wherein the metadata includes whether a collision occurred or not in the first scenario or the second scenario from which the data is extracted.

13. The method of claim 1, further comprising:
transforming the extracted data or third scenario prior to injecting the extracted data into the third scenario.

14. The method of claim 1, further comprising
automatically generating a plurality of augmented scenarios, each of the plurality of augmented scenarios created by injecting one or more of a plurality of data extracted from one or more recorded scenarios into one or more of a plurality of recorded scenarios; and
automatically simulating the automated vehicle driving software with the plurality of augmented scenarios.

15. The method of claim 1, wherein extracting the data and injecting the extracted data are performed automatically.

16. A non-transitory computer-readable medium including instructions, which when executed by one or more processors, cause the one or more processors to perform a method of:
extracting data from a first scenario or a second scenario, the data corresponding to a difference between the first scenario recorded by one or more first vehicle sensors and the second scenario recorded by one or more second vehicle sensors, wherein the first scenario shares at least one characteristic with the second scenario;
injecting the extracted data into a third scenario recorded by one or more third vehicle sensors to generate a fourth scenario; and
simulating automated vehicle driving software with the fourth scenario.

17. A system comprising:
a first database comprising a plurality of recorded scenarios;
a second database comprising a plurality of extracted data; and
one or more processors coupled to the first and second databases and configured to:
automatically analyze the plurality of scenarios in the first database to identify scenarios sharing at least one characteristic;
extract data corresponding to one or more differences between the identified scenarios;
store the extracted data in the second database; and
generate a plurality of augmented scenarios based on the plurality of scenarios and the plurality of extracted data.

18. The system of claim 17, the one or more processors further configured to:
simulate automated driving software with the plurality of augmented scenarios.

* * * * *